US009305740B2

(12) United States Patent
Frosien et al.

(10) Patent No.: US 9,305,740 B2
(45) Date of Patent: Apr. 5, 2016

(54) CHARGED PARTICLE BEAM SYSTEM AND METHOD OF OPERATING THEREOF

(71) Applicants: Jürgen Frosien, Riemerling (DE); Benjamin John Cook, Munich (DE)

(72) Inventors: Jürgen Frosien, Riemerling (DE); Benjamin John Cook, Munich (DE)

(73) Assignee: ICT Integrated Circuit Testing Gesellschaft für Halbleiterprüftechnik mbH, Heimstetten (DE)

(*) Notice: Subject to any disclaimer, the term of this patent is extended or adjusted under 35 U.S.C. 154(b) by 0 days.

(21) Appl. No.: 13/920,284

(22) Filed: Jun. 18, 2013

(65) Prior Publication Data
US 2014/0367586 A1 Dec. 18, 2014

(30) Foreign Application Priority Data

Jun. 17, 2013 (EP) .................................. 13172298

(51) Int. Cl.
*H01J 37/04* (2006.01)
*H01J 37/147* (2006.01)
(Continued)

(52) U.S. Cl.
CPC .......... *H01J 37/045* (2013.01); *H01J 37/1478* (2013.01); *H01J 37/153* (2013.01); *H01J 37/263* (2013.01); *H01J 2237/1534* (2013.01); *H01J 2237/281* (2013.01); *H01J 2237/2815* (2013.01)

(58) Field of Classification Search
CPC ... H01J 37/147; H01J 37/045; H01J 37/1478; H01J 37/244; H01J 37/0455; H01J 37/2443
USPC ........................................................ 250/397
See application file for complete search history.

(56) References Cited

U.S. PATENT DOCUMENTS 3,714,422 A * 1/1973 Hosoki et al. ..................... 850/8
4,465,934 A 8/1984 Westerberg et al.
5,892,224 A * 4/1999 Nakasuji ....................... 250/310
(Continued)

FOREIGN PATENT DOCUMENTS

EP 1577926 A1 9/2005
EP 2378537 A1 10/2011
JP 2009-134926 A 6/2009

OTHER PUBLICATIONS

European Search Report dated Oct. 30, 2013 for Application No. 13172298.5.

(Continued)

*Primary Examiner* — Robert Kim
*Assistant Examiner* — Sean Luck
(74) *Attorney, Agent, or Firm* — Patterson & Sheridan, LLP

(57) ABSTRACT

A charged particle beam device is described. In one aspect, the charged particle beam device includes a charged particle beam source, and a switchable multi-aperture for generating two or more beam bundles from a charged particle beam which includes: two or more aperture openings, wherein each of the two or more aperture openings is provided for generating a corresponding beam bundle of the two or more beam bundles; a beam blanker arrangement configured for individually blanking the two or more beam bundles; and a stopping aperture for blocking beam bundles. The device further includes a control unit configured to control the individual blanking of the two or more beam bundles for switching of the switchable multi-aperture and an objective lens configured for focusing the two or more beam bundles on a specimen or wafer.

16 Claims, 7 Drawing Sheets

(51) Int. Cl.
*H01J 37/153* (2006.01)
*H01J 37/26* (2006.01)

(56) References Cited

U.S. PATENT DOCUMENTS

| | | | | |
|---|---|---|---|---|
| 6,124,140 | A * | 9/2000 | Do et al. | 438/10 |
| 6,566,655 | B1 * | 5/2003 | Choo et al. | 850/9 |
| 6,809,808 | B2 * | 10/2004 | Feldman et al. | 356/237.1 |
| 6,812,462 | B1 * | 11/2004 | Toth et al. | 850/1 |
| 6,879,390 | B1 * | 4/2005 | Kvamme et al. | 356/237.2 |
| 7,084,414 | B2 * | 8/2006 | Wieland et al. | 250/492.23 |
| 7,348,585 | B2 * | 3/2008 | Miyakawa et al. | 250/559.41 |
| 7,423,269 | B1 * | 9/2008 | Azordegan et al. | 250/311 |
| 7,659,506 | B2 * | 2/2010 | Avinun-Kalish et al. | 250/304 |
| 7,732,762 | B2 * | 6/2010 | Nijkerk et al. | 250/310 |
| 7,777,183 | B2 * | 8/2010 | Kaneoka et al. | 250/306 |
| 7,858,936 | B2 * | 12/2010 | Bray et al. | 250/307 |
| 7,910,885 | B2 * | 3/2011 | Rosenberg et al. | 250/310 |
| 7,973,280 | B2 * | 7/2011 | Takahashi et al. | 250/307 |
| 8,003,952 | B2 | 8/2011 | Muray et al. | |
| 8,148,702 | B2 * | 4/2012 | Doering et al. | 250/492.22 |
| 2004/0104353 | A1 * | 6/2004 | Berglund | 250/396 R |
| 2005/0270522 | A1 * | 12/2005 | Miyakawa et al. | 356/237.2 |
| 2007/0051888 | A1 * | 3/2007 | Rosenberg et al. | 250/310 |
| 2008/0029699 | A1 * | 2/2008 | Kaneoka et al. | 250/307 |
| 2009/0020698 | A1 * | 1/2009 | Muto et al. | 250/310 |
| 2009/0078867 | A1 * | 3/2009 | Avinun-Kalish et al. | 250/309 |
| 2009/0134327 | A1 * | 5/2009 | Ikku et al. | 250/307 |
| 2009/0242759 | A1 * | 10/2009 | Bray et al. | 250/307 |
| 2010/0178602 | A1 * | 7/2010 | Seto et al. | 430/30 |
| 2011/0220795 | A1 * | 9/2011 | Frosien | 250/307 |
| 2011/0253893 | A1 * | 10/2011 | Banzhof | 250/307 |
| 2011/0284763 | A1 * | 11/2011 | Henstra | 250/396 R |
| 2011/0297827 | A1 * | 12/2011 | Asai et al. | 250/310 |
| 2012/0043463 | A1 * | 2/2012 | Agemura et al. | 250/310 |
| 2012/0091359 | A1 * | 4/2012 | Lanio et al. | 250/396 R |
| 2012/0104254 | A1 * | 5/2012 | Shishido et al. | 250/310 |
| 2013/0032729 | A1 | 2/2013 | Knippelmeyer | |

OTHER PUBLICATIONS

Communication pursuant to Article 94(3) EPC for European Application No. 13172298.5 dated Jan. 29, 2016.
K. Koyama et al., "EBT-1: A highly automated, practical electron beam tester," Journal of Vacuum Science and Technology: Part B, vol. 6, No. 6, Nov. 1, 1988, pp. 1985-1962.

* cited by examiner

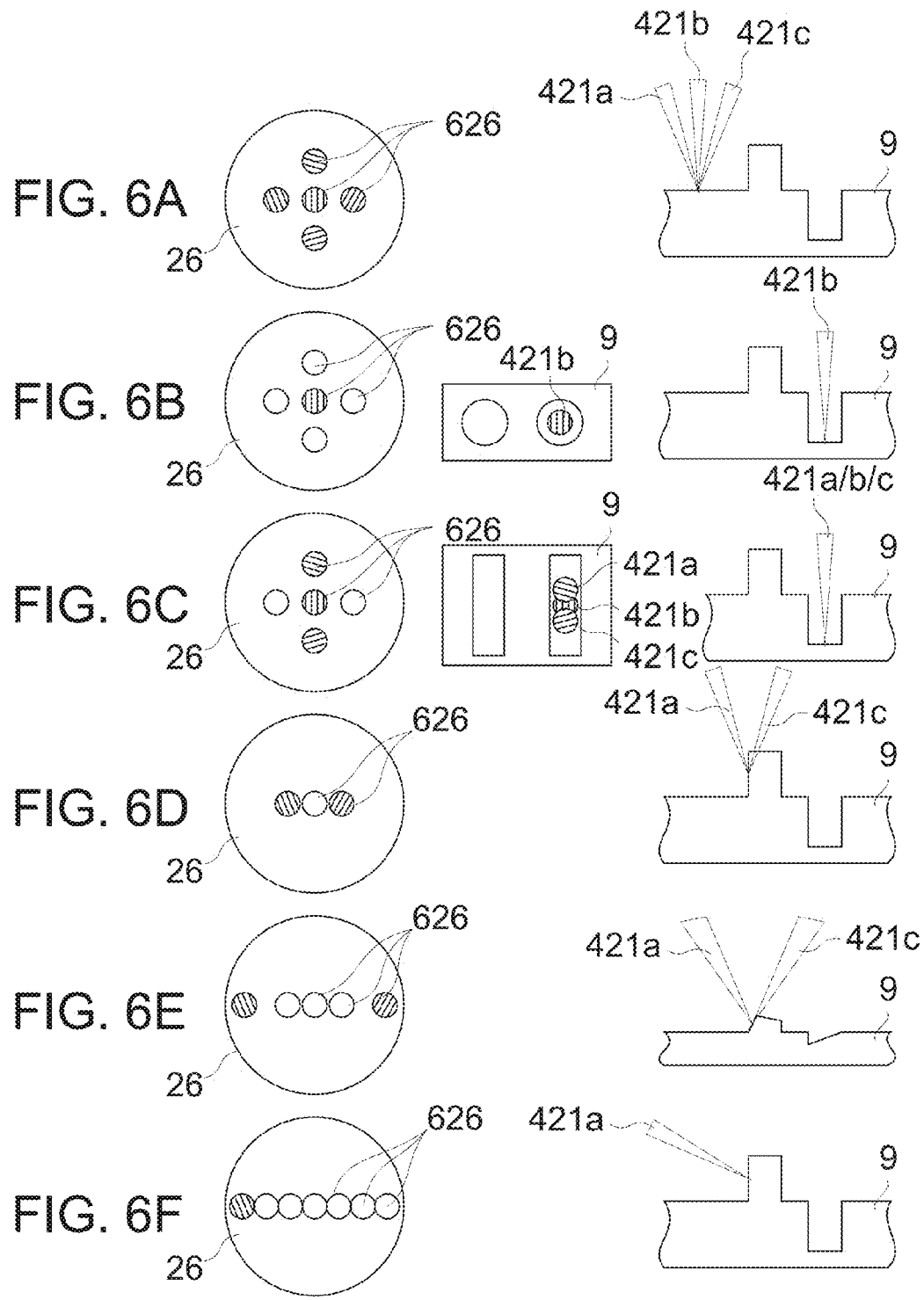

CHARGED PARTICLE BEAM SYSTEM AND METHOD OF OPERATING THEREOF

TECHNICAL FIELD OF THE INVENTION

Embodiments of the invention relate to charged particle beam devices, for example, for inspection system applications, testing system applications, lithography system applications, defect review or critical dimensioning applications or the like. It also relates to methods of operation thereof. Further, embodiments of the invention relate to 3D imaging devices and 3D imaging with particle beams. Specifically, they relate to a charged particle beam device and a method of generating a 3D image of a specimen or wafer.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring, is often done with charged particle beams, e.g. electron beams, which are generated and focused in charged particle beam devices, such as electron microscopes or electron beam pattern generators. Charged particle beams offer superior spatial resolution compared to, e.g. photon beams due to their short wavelengths.

In semiconductor technology not only miniaturization but also using the $3^{rd}$ dimension takes place in order to get more and better functionality into electronic devices. In particular, using the $3^{rd}$ dimension gives challenges to process control in which the surface structures need to be imaged with high resolution for metrology, inspection and defect review.

In the past it was mainly a resolution challenge since the surface structures were more or less planar or had reasonable aspect ratios. Going to 3-D devices, structures of several hundreds of nanometer have to be imaged containing aspect ratios of more than 20.

This change in device architecture provides the need for high resolution particle beam imaging systems, e.g. electron & ion beam systems, which are capable of imaging not only surfaces but also deep holes and side walls with good signal to noise ratio. Additionally the height information should be available and, if possible, measurable. Presently scanning electron microscope based tools are used for these purposes (CD-SEM, DR-SEM, EBI-tools). However, these tools reach their limits for the desired applications.

Normally in electron beam tools fine electron probes are generated. For example, a high brightness source (e.g. a thermal field emission or cold field emission source) generates an electron beam. The source (or virtual source) is imaged onto the sample surface. This is done by an objective lens and in many cases in combination with one or more condenser lenses. The condenser lens system can provide aperture angle adaption to achieve the optimum aperture angle in the optical system according to the used probe current. Additionally probe current adjustment and spot size variations can be performed with the condenser system.

The aperture angle itself is defined by a mechanical hole. The electron probe is scanned by a 1-, 2- or more stage deflection system across the sample for image generation. The generated signal particles, i.e. secondary electrons and/or backscattered electrons (SE and/or BSE) are detected by post lens, in-lens or pre-lens detection systems or combinations hereof.

Since normally low energy (<5 keV) electrons are used for the mentioned applications, advantageously retarding field optics are used which apply a high beam energy inside the column and which will generate the final landing energy next to the sample (inside the objective lens, between objective lens and sample or a combination hereof). The low landing energies mean that due to brightness limitations to obtain a large current at the sample a large aperture angle must be used; this increases both spherical and chromatic aberrations.

For 3-D samples this kind of imaging has limitations as can be seen from FIG. 1. The triangles 11, 12, and 13 represent the beam with its divergence angle. This divergence angle is typically optimized and based on a compromise between diffraction, aberrations (spherical and/or chromatic) and e-e-interactions (electron-electron-interaction). Thus, the divergence angle is not freely or arbitrarily selectable. As previously mentioned the divergence angle should be as large as possible for obtaining high probe currents and sufficient signal to noise.

As can be seen for area 21 of specimen 9 no problems occur to image the area. In area 22 the lower edge can hardly be imaged, and imaging of the side wall is impossible. This is due to the divergence and the fact that the beam "touches" the protrusion as indicated by area 3. In area 23 both side walls and the lower corners cannot be imaged, as indicated by the second area 3. This is not only because of geometrical issues but also because of signal to noise issues. The signal from the bottom of the hole is low in comparison to the signal at the top. The signal electrons generated in area 3 for the triangle 13 illustrating the beam imaging area 23 are mixed with the signal electrons from the bottom of the hole and might even dominate the signal.

Part of the problem can be solved by tilting the beam during scanning the surface. Some hardware solutions for beam tilt and resulting benefits have been described. Yet, further benefits are desired for 3-D imaging on industrial standards.

SUMMARY OF THE INVENTION

In light of the above, a charged particle beam and a method of generating a 3D image of a specimen or wafer are provided. Further aspects, advantages, and features of the present invention are apparent from the dependent claims, the description, and the accompanying drawings.

According to one embodiment, a charged particle beam device is provided. The charged particle beam device includes a charged particle beam source for emitting a charged particle beam, and a switchable multi-aperture for generating two or more beam bundles from the charged particle beam, wherein the switchable multi-aperture includes: two or more aperture openings, wherein each of the two or more aperture openings is provided for generating a corresponding beam bundle of the two or more beam bundles; a beam blanker arrangement configured for individually blanking the two or more beam bundles; and a stopping aperture for blocking beam bundles, which are blanked off by the beam blanker arrangement. The device further includes a control unit electrically connected to the beam blanker arrangement and configured to control the individual blanking of the two or more beam bundles for switching of the switchable multi-aperture, and an objective lens configured for focusing the two or more beam bundles on a specimen or wafer, wherein the two or more beam bundles are tilted with respect to the specimen or wafer depending on the position of each of the two or more beam bundles relative to an optical axis defined by the objective lens, and wherein the objective lens is configured for focusing the charged particle beam source, a virtual source provided by the charged particle beam source or a crossover.

According to another embodiment, a method of generating a 3D image of a specimen or wafer is provided. The method includes imaging the specimen or wafer with a first group of beam bundles, wherein the first group of beam bundles includes one or more beam bundles, switching from the first group of beam bundles to a second group of beam bundles with a switchable multi-aperture, wherein the second group of beam bundles can include one or more beam bundles, and wherein at least one beam bundle differs in the second group of beam bundles as compared to the first group of beam bundles, and imaging the specimen or wafer with the second group of beam bundles, wherein the one or more beam bundles are tilted with respect to the specimen or wafer depending on the position of each of the one or more beam bundles relative to an optical axis defined by an objective lens.

Embodiments are also directed at apparatuses for carrying out the disclosed methods and include apparatus parts for performing each described method step. These method steps may be performed by way of hardware components, a computer programmed by appropriate software, by any combination of the two or in any other manner. Furthermore, embodiments according to the invention are also directed at methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following:

FIGS. 6A to 6F show schematic views of apertures with two or more openings and the options to switch the respective beamlets or beam bundles for different applications or measurement modes;

DETAILED DESCRIPTION OF EMBODIMENTS

Figure 1:
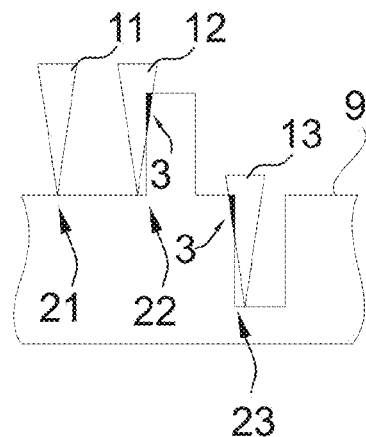
FIG. 1 shows a schematic view of problems encountered with 3-D measurement of common systems.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as a charged particle beam device including the detection of secondary electrons. Embodiments of the present invention can still be applied for apparatuses and components detecting corpuscles, such as secondary and/or backscattered charged particles in the form of electrons or ions, photons, X-rays or other signals in order to obtain a specimen image. Generally, when referring to corpuscles they are to be understood as light signals in which the corpuscles are photons as well as particles, in which the corpuscles are ions, atoms, electrons or other particles.

As describe herein, discussions and descriptions relating to the detection are exemplarily described with respect to electrons in scanning electron microscopes. However, other types of charged particles, e.g. positive ions, could be detected by the device in a variety of different instruments.

According to embodiments herein, which can be combined with other embodiments, a signal beam is referred to a beam of secondary particles or a secondary beam, i.e. secondary and/or backscattered particles. Typically, the signal beam or secondary beam is generated by the impingement of the primary beam on a specimen. A primary beam is generated by a charged particle beam source and is guided and deflected on a specimen to be inspected or imaged.

A "specimen" as referred to herein, includes, but is not limited to, semiconductor wafers, semiconductor workpieces, and other workpieces such as memory disks and the like. Embodiments of the invention may be applied to any workpiece on which material is deposited or which is structured. A specimen includes a surface to be structured or on which layers are deposited, an edge, and typically a bevel. According to some embodiments, which can be combined with other embodiments described herein, the apparatus and methods are configured for or are applied for electron beam inspection, for critical dimensioning applications and defect review applications Generally, when referring to focusing a charged particle beam, it is understood that the beam of charged particles is reduced in divergence or introduces a convergence. This means, the charged particles of a beam are focused or at least collimated towards a subsequent beam optical element to decrease losses of charged particles due to divergence or due to blocking of charged particles. Correspondingly, defocusing is understood as increasing the divergence or reducing the convergence.

Figure 2:
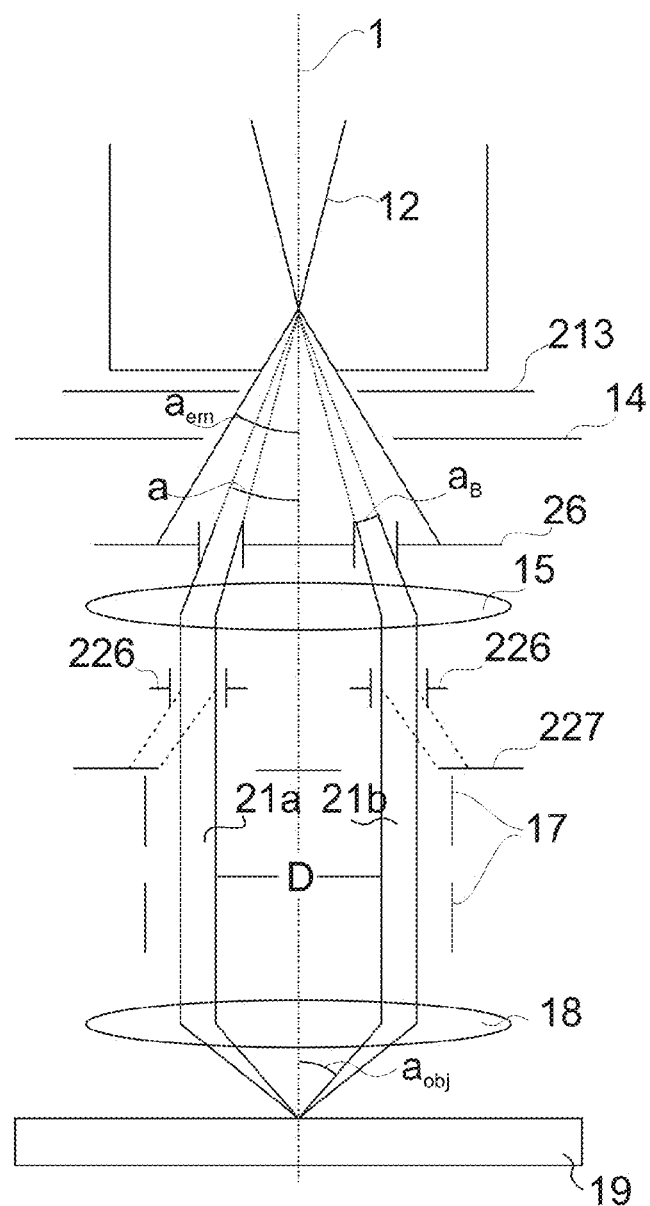
FIG. 2 shows a schematic side view of a charged particle beam device according to one embodiment of the present invention.

An embodiment according to the invention is shown in FIG. 2. Therein, an electron beam device with an optical axis 1 is shown. The electrons emitted by emitter 12 under emission angle $\alpha_{em}$ are extracted by extractor 213 and by anode 14. Aperture arrangement 26 blocks parts of the electrons, whereby a plurality of electron beams (beam bundles or beamlets) are generated. These beam bundles travel separated from aperture arrangement 26 to specimen 19. Each of these beam bundles are independent electron beams. They are interaction limited and interaction optimized, respectively. However, the independent electron beams are separated from each other by a distance such that no interaction or reduced interaction occurs between the individual electron beams.

The beam bundles (independent electron beams) travel independently through the optical system. Thereby, the electron beams indicated by reference numbers 21a and 21b in FIG. 2 pass through condenser lens 15 and scan deflectors 17 in order to be focused by objective lens 18 into a common probe on the specimen. The charged particle beam bundles are focused onto the same location. The location may be defined as having a maximal dimension of 200 nm. Thus, objective lens 18 focuses the independent electron beams onto the same focal point in the focal plane.

Independent of specific embodiments, an aspect of the invention may generally be described as follows. Charged particles are emitted from a single emitter. Further, at least two independent beam bundles are generated from the charged particles emitted by the single emitter. The independent beam bundles are guided through the column substantially parallel and are focused by one objective lens into one charged particle probe.

Independent of specific embodiments described herein, the lenses and especially the objective lens may either be electrostatic, magnetic or compound electrostatic-magnetic.

The embodiments described herein include an aperture 26 and one or more elements (see, e.g. reference numerals 226 and 227) to control the beam bundles arriving at the specimen 19. Thereby, a switchable aperture array or switchable multi-aperture, i.e. an aperture generating two or more beam bundles, is provided. As shown in FIG. 2, the switchable aperture array or switchable multi-aperture includes the beamlet defining aperture 26, respective beamlet blankers 226, and one or more stopping apertures 227. According to some embodiments, these elements can be separated in different modules and/or different planes. However, it is also possible that all 3 components are integrated in one module, or at least the one or more beamlet defining apertures and beamlet blankers 226 are integrated in one module. An integrated beamlet shaping and switching module can be placed just below the gun area, after a condenser/condenser lens system, or between condenser lenses in the case that more lenses are involved.

According to typical embodiments, the aperture 26 includes two or more openings for defining the beam bundles or beamlets. Yet, it is also possible that two or more apertures each defining one beam bundle or beamlet are provided, typically in one plane along the optical axis 1. Accordingly, the aperture 26, as e.g. shown in FIG. 2, can be a single-piece component or a multi-piece component in order to provide the two or more openings for generating two or more beamlets or beam bundles.

According to yet further embodiments, which can be combined with other embodiments described herein, the beamlet blankers 226, can be deflectors, e.g. electrostatic deflectors, which deflect the respective beamlet away from the beam path for impingement on the specimen 19. This is indicated by dashed beam path 221a and 221b. Thereby, the beamlets can be individually blocked. For example, the beamlet blankers 226 deflect the beamlets to impinge on the stopping aperture 227. One or more of the beamlets do not pass through the respective opening in the stopping aperture.

According to typical embodiments, which can be combined with other embodiments described herein, the stopping aperture has a number of aperture openings that corresponds to the number of aperture openings in the aperture 26. The number of aperture openings in the stopping aperture corresponds to the number of beamlets or beam bundles.

As described above, the beamlet blankers or a beamlet blanker unit and the stopping aperture allows for switching on or off individual beamlets or groups of beamlets. Thereby, a switchable aperture array or switchable multi-aperture is provided.

As shown in FIG. 2, embodiments having a beam path without a crossover can be considered advantageous. Since each of the electron beam bundles 21a and 21b is optimized with regard to the beam current, the electron current density on the specimen can be increased n-times by providing n electron beam bundles, wherein n is 1 or above. Thereby, aperture arrangement 26 is arranged close to the emitter so that a separation into independent electron beams takes place as soon as possible within the column.

According to embodiments described herein, the separation of the beam bundles and/or the different location of the beam bundles relative to the optical axis 1, together with the focusing properties of the objective lens 18, results in different impingement angles of the beamlets or beam bundles on the specimen 19.

According to embodiments described herein, the aperture 26 is used to generate the independent beamlets or beam bundles. The aperture is not focused on the specimen 19, e.g. the objective lens is not configured to focus the aperture openings of the aperture 26 on the specimen. Instead the objective lens 18 is configured to focus a beam source, a virtual beam source or a cross-over onto the specimen 19.

Figures 3, 4:
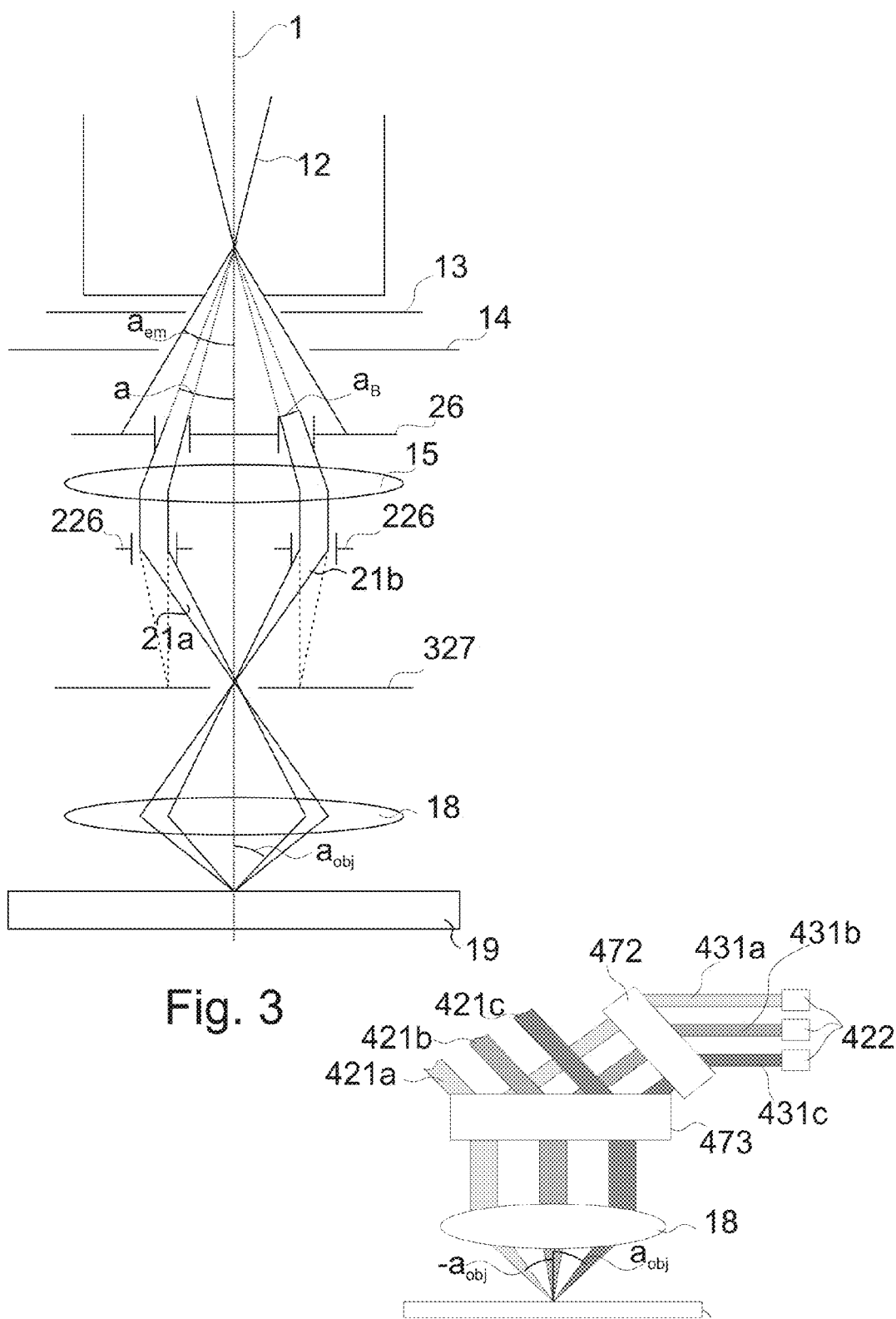
FIG. 3 shows a schematic side view of another charged particle beam device according to one embodiment of the present invention.
FIG. 4 shows a schematic view for illustrating primary beamlet paths and secondary beamlet paths for individual detection according to embodiments described herein.

Another embodiment according to the invention is shown in FIG. 3 and yet further embodiments are described while referring to FIG. 3. Similar to the embodiment shown in FIG. 2, an electron beam device with an optical axis 1 is shown. The electrons emitted by emitter 12 under emission angle $\alpha_{em}$ are extracted by extractor 213 and by anode 14. Aperture arrangement 26 blocks parts of the electrons, whereby a plurality of electron beams (beam bundles or beamlets) are generated. These beam bundles travel from aperture arrangement 26 to specimen 19.

The electron beams indicated by reference numbers 21a and 21b in FIG. 3 pass through condenser lens 15 in order to be focused by objective lens 18 into a common probe on the specimen. The charged particle beam bundles are focused onto the same location. The location may be defined as having a maximal dimension of 200 nm. Thus, objective lens 18 focuses the independent electron beams onto the same focal point in the focal plane.

The embodiments described herein include an aperture 26 and one or more elements (see, e.g. reference numerals 226 and 327) to control the beam bundles arriving at the specimen 19. Thereby, a switchable aperture array or switchable multi-aperture, i.e. an aperture generating two or more beam bundles, is provided. As shown in FIG. 3, the switchable aperture array or switchable multi-aperture includes the beamlet defining aperture 26, respective beamlet blankers 226, and one (or more) stopping aperture 327. In the case that the beam bundles 21a and 21b are deflected, e.g. by beam blankers, to pass through one aperture opening in the stopping aperture, a common stopping aperture 327 or a stopping aperture 327 with an aperture opening that is common to two or more beam bundles can be provided. According to some embodiments, in such a case a cross-over can be generated for each of the beam bundles (see, e.g., FIG. 3). Yet, alternatively, the beam bundles can also be deflected through the common stopping aperture without a cross-over. Thereby, for example, the electron-electron-interaction can be reduced as compared to a beam path having cross-overs in the beamlets or beam bundles.

According to some embodiments, the elements of the switchable aperture array or switchable multi-aperture can be separated or integrated with each other as described with respect to FIG. 2. As described above, the beamlet blankers or a beamlet blanker unit and the stopping aperture allow for switching on or off of individual beamlets or groups of beamlets. Thereby, a switchable aperture array or switchable multi-aperture is provided.

Accordingly, also a common stopping aperture can be used in case of a cross over mode of the ray paths like in FIG. 3. Typically, in such a case also the beamlet defining aperture and blanker can be integrated into one module. According to typical embodiments, which can be combined with other embodiments described herein, each beamlet blanker or one or more of the beam blankers can be a multi-pole element, e.g. allowing exact positioning, individual astigmatism correction, and focusing of each beamlet.

According to embodiments described herein, individual beamlets or beam bundles are utilized to generate different impingement angles in a specimen or wafer. Thereby, a switchable aperture array or switchable multi-aperture is utilized to switch on or off, respectively, the different impingement angles in order to generate a 3D-image of the specimen or wafer.

FIG. 4 shows three beamlets 421a, 421b, and 421c which are generated by a source and a switchable aperture array or switchable multi-aperture. The source, a virtual source or a cross-over is imaged onto the specimen 19 such that the beamlets impinge on the same location on the specimen 19. The beamlets 421a, 421b, and 421c are primary beamlets, i.e. they impinge on the specimen to generated SEs or BSEs, that is secondary or signal beamlets. The signal beamlets 431a, 431b, and 432c are detected. The primary and secondary beamlets are separated by a beam separator 473, e.g. an ExB deflector, a Wien filter, a magnetic deflector, or an achromatic beam separator. Typically, the beam separator 473 includes at least one magnetic deflector. The signal beamlets 431a, 431b, and 432c are further deflected by a beam bender 472, such as a sector, e.g. a hemispherical sector, or another element to deflect the signal beamlets. As shown in FIG. 4, individual detection elements 422 are provided for each of the beamlets. Further details of the signal beam paths are described below.

As shown in FIG. 4 a first beamlet 421a impinges with an angle of $-a_{obj}$, a second beamlet 421b impinges with an angle of 0° and a third beamlet impinges with an angle of $a_{obj}$. By a switchable aperture array or switchable multi-aperture, each of the angles can be selected individually for imaging of the specimen or wafer. Further, two or more of the beamlets can be combined for an image.

Some embodiments, which can be combined with other embodiments described herein, provide a separation of primary beamlets and secondary beamlets. This enables an efficient detection as shown in FIG. 4. In particular a segmented detector (or multiple individual detectors 422) is preferable which detects signal electrons with different information content independently. Thereby, bright field image, a dark field image, and an angular resolved image can be detected dependently. Suitable detector arrangements are exemplarily described with respect to FIGS. 8A to 9B below. In the event of a defective detector, the SE optics may include deflectors or other optical elements to move one of the bundles to another detector, thus introducing some redundancy into the system.

Figure 5:
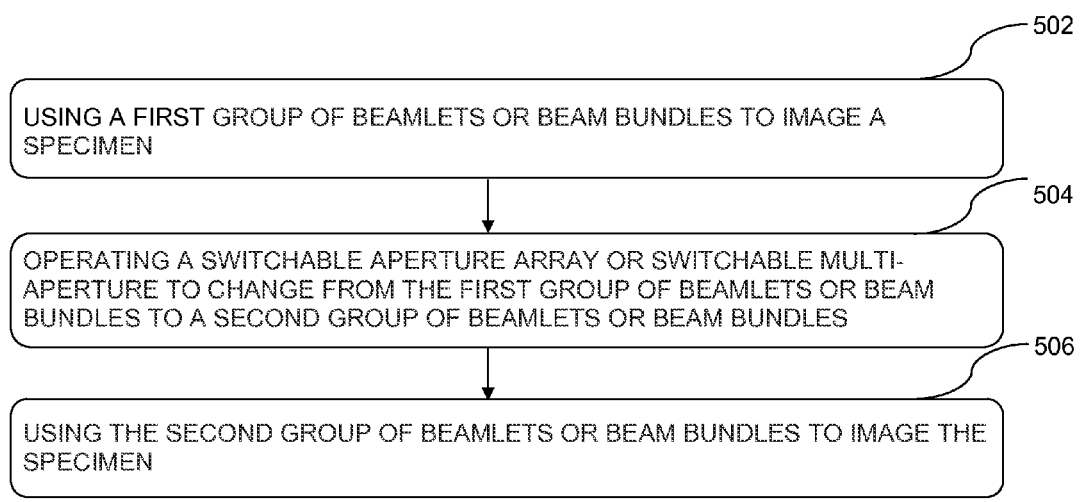
FIG. 5 shows a schematic side view of charged particle beam devices according to embodiments of the present invention, whereby an aberration correction element is included.

FIG. 5 illustrates some embodiments of operating a charged particle beam device. In step 502, a first group of beamlets or beam bundles is used to image a specimen or wafer. Thereby, the first group of beamlets or beam bundles can include one or more beamlets or beam bundles. In step 504, a switchable aperture array or switchable multi-aperture is operated to change from the first group of beamlets or beam bundles to a second group of beamlets or beam bundles. Thereby, the second group of beamlets or beam bundles can include one or more beamlets or beam bundles, wherein at least one beamlet or beam bundle differs from the second group of beamlets or beam bundles as compared to the first group of beamlets or beam bundles. In step 506, the second group of beamlets or beam bundles is used to image the specimen or wafer.

According to typical embodiments, the switchable aperture array or switchable multi-aperture thereby generates two or more beamlets or beam bundles and a combination of a blanker and a stopping aperture is used to switch in or off respective ones of the two or more beamlets or beam bundles.

According to some embodiments, the primary electron (PE) optics can utilize a retarding field optics (beam booster). Thereby, the primary electrons are guided through the column on a high potential, e.g. 20 keV or above and are decelerated with an energy ration of e.g. at least 10, 20 or even 30 by an electrostatic component of the objective lens. A primary beamlet to signal beamlet separation for detection can be performed as described with respect to FIG. 7A below.

A typical embodiment, which can be combined with other embodiments described herein, includes a column beam boosting with an additional retarding field for the PE beam between the compound objective lens and sample, i.e. the specimen or wafer.

Since off-axial beams are involved in the presented invention, components and/or modules for aberration correction, in particular spherical aberration correction (and if necessary chromatic aberration correction), can be implemented.

According to some embodiments, which can be combined with other embodiments described herein, a spherical correction can be provided by a method of operating a charged particle beam device for measuring a critical dimension of a specimen. Therein, the method includes generating a charged particle beam on an axis, correcting spherical aberrations of the charged particle beam allowing for increasing the beam aperture angle to a larger beam aperture angle, focusing the charged particle beam onto a specimen, and defining a corrected beam aperture angle adjusted to reduce diffraction, wherein the corrected beam aperture angle is the larger beam aperture angle, wherein the charged particle beam is provided having a beam aperture angle smaller than the corrected beam aperture angle. Further, the charged particle beam is tilted by a beam tilt angle which is equal to or less than the corrected beam aperture angle such that the beam is tilted having an outermost ray within the corrected beam aperture angle.

According to yet further embodiments, which can be combined with other embodiments described herein, when the beamlet blankers are multi-poles, e.g. 4-poles, 6-poles or particularly 8-poles, as mentioned above, then aberrations in the final spot on the specimen can be corrected. Thereby, an individual correction of the beamlets or beam bundles can be provided. In this case, a global aberration correction might even be avoided. Further, having a beamlet blanker or a beamlet blankers provided as multi-poles (at least quadrupoles, i.e.

4-poles), individual beams can be focused at different sample heights which makes 3D imaging faster and/or enables 3D reconstruction.

With the proposed configuration, in particular in the aberration corrected version a wide variety of high resolution imaging modes especially suitable for 3-D applications can be provided. Further advantages, as mentioned above and described in more detail with respect to FIGS. 8A to 8C, can be achieved by a segmented detector detecting independent signal particles with different starting conditions and coming from different locations/heights of the 3-D samples. The advantages can be generated by a suitably designed switchable aperture module which is arranged and shaped according to the requested image mode as exemplarily illustrated in FIGS. 6A to 6F. Two-dimensional arrays or patterns are yet further possible.

FIG. 6A shows an aperture 26 and a cross-sectional side view of a specimen 9. Thereby, an application or measurement mode for which most or all of the beamlets are used is described. In this mode, essentially all other configurations or modes are simultaneously operating, assuming each beamlet has a separate detector as described with respect to FIG. 4. In light of the fact that topographic structures on the specimen, which are to be measured with a 3D measurement result in average starting angles, which are different from a normal of the specimen or plane, the selection of the detectors according to the starting angle corresponds to the topography of the specimen. As this, in turn, corresponds to the most prominent beam bundle angles to be used for impingement of the beam bundle on the specimen, a cross-talk for different structures on the specimen can be reduced or even avoided. For example, a structure which is to be illuminated by the electron beam from the left side in light of its structure also has an average starting angle of SEs or BSEs to the left side and a topography detector, as described herein, can be used to improve the signal-to-noise ratio for 3D measurement.

As shown in FIGS. 6A to 6F, an aperture 26 includes three, five, or seven aperture openings 626, respectively. Accordingly, an aperture array with a cross-shaped array or a multi-aperture is provided. In combination with a beam blanker and, e.g. a stopping aperture, each of the beamlets or beam bundles or at least groups of beamlets can be individually switched on or off. Accordingly, a switchable multi-aperture is provided.

In FIG. 6A, all five beamlets are switched on. In the cross-section of the specimen 9, which is shown in FIG. 6A, only three of the beamlets, namely beamlets 421a, 421b, and 421c, can be seen. By having all beamlets switched on, a high current mode, e.g. for flat areas can be provided. Further, a bright field and dark field image can be generated dependent on detector segmentation. Particularly for embodiments wherein each beamlet has a separate detector as e.g. shown in FIG. 4 all below modes can operate simultaneously. Thereby, full detection flexibility can be provided.

FIG. 6B shows an example, wherein a specimen 9 includes a 2-dimensional protrusion, such as a dot, a particle, or a post, and a hole. This can be seen in the cross-sectional side view and the top view shown in FIG. 6B. For such a measurement mode it is possible to use only a central beamlet 412b. According to typical embodiments, the central beamlet or beam bundle has a tilt angel of 0°. Thereby, stray particles from a position different than the bottom of the hole of the specimen 9 can be avoided or reduced.

FIG. 6B shows an aperture 26, a cross-sectional side view, and a top view of a specimen 9. Thereby, an application or measurement mode for deep hole imaging can be provided. Typically, a bright field detector segment is used. Yet, it has to be considered that such a measurement mode has a reduced current, which results in a reduced signal to noise ratio at constant imaging speed.

FIG. 6C shows an aperture 26 and a cross-sectional side view of yet another specimen 9. Thereby, a trench and a line is provided on the specimen. Accordingly, a measurement mode for deep trench imaging with higher current and high resolution in one direction (e.g. y-direction) can be provided. Thereby, a trench bottom imaging can be provided. A dark field detector can be provided, which segment images (e.g. y-direction). According to some embodiments, this may also be extended to 2D for imaging cylindrical structures.

FIG. 6D shows a measurement mode, wherein a first beamlet 421a and a second beamlet 421c are provided, wherein both of the beamlets have a tilt angle larger than zero and are essentially tilted to impinge from opposite directions. According to yet further embodiments, which can be combined with other embodiments described herein, the example shown in FIG. 6D can be further modified by using either beamlet 421a or beamlet 421c. Thereby, the side wall imaging can be left enhanced (beamlet 421a) or can be right enhanced (beamlet 421c). According to typical embodiments a bright field and/or dark field detector can be provided. According to some embodiments, this may also be extended to 2D for imaging cylindrical structures. According to some implementations, the absolute value of the tilt angle can be 0.5° to 3° for such an application.

FIG. 6E shows an aperture 26 and a cross-sectional side view of yet another specimen 9. Thereby, shallow defects are provided on the specimen. FIG. 6E shows a measurement mode, wherein a first beamlet 421a and a second beamlet 421c are provided, wherein both of the beamlets have a large tilt angle, for example of 3° or above, and are essentially tilted to impinge from opposite directions. Accordingly, a measurement mode with confocal beams and, e.g. a low depth of focus can be provided. Such a measurement mode is excellent for detecting shallow defects. Typically, a bright field detector segment can be utilized. According to some implementations, the absolute value of the tilt angle can be 3° to 5° for such an application.

FIG. 6F shows an aperture 26 and a cross-sectional side view of yet another specimen 9. Thereby, very large tilt angles are provided for impingement of e.g. one beamlet 421a on the specimen. By changing the focus of an electrostatic lens the complete side wall or portions thereof might be scanned. Alternatively or additionally, the natural spherical aberration of the lens might be used for changing the focus, which can be combined with deflection action of the beamlet blanker in order to scan the complete side wall or portions thereof. According to typical implementations, the angle can be 5° or above, for example 5° to 10° or even 5° to 15°.

Figure 7A:
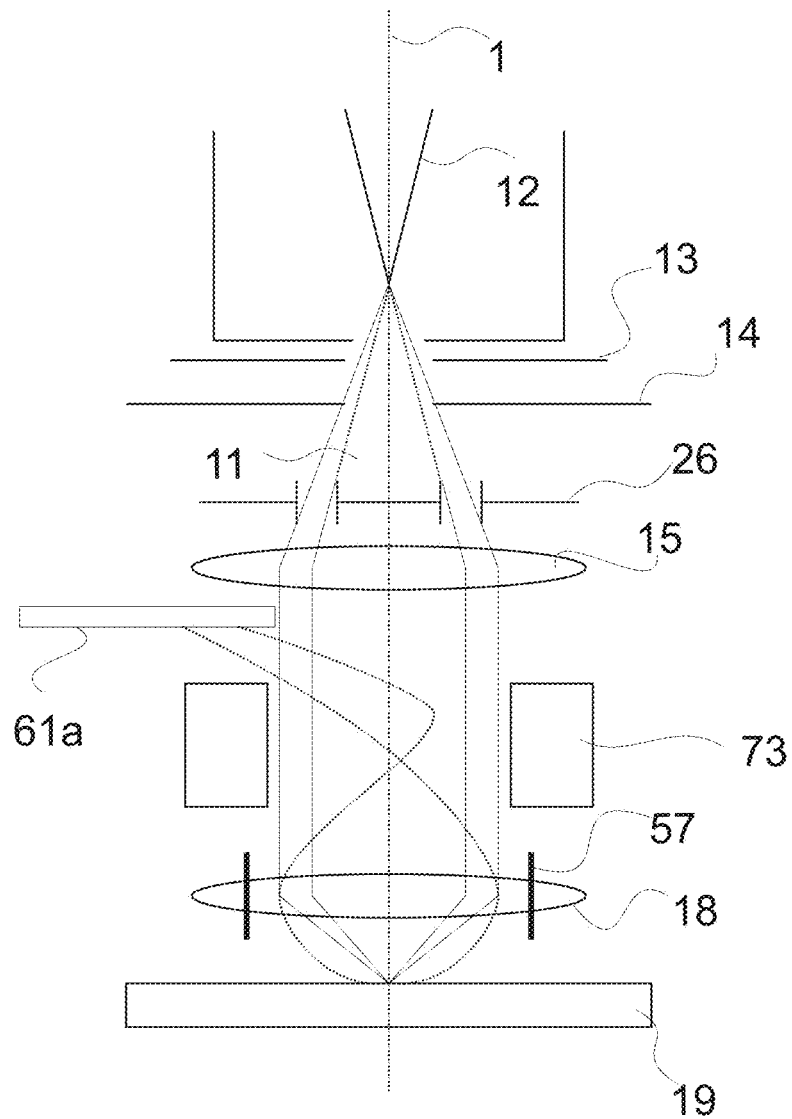
FIG. 7A shows a schematic side view of charged particle beam devices according to embodiments, wherein the separation of the primary and secondary beamlets is further illustrated.

According to yet further embodiments, and as briefly explained above, a separation of the primary beamlets and the signal beamlets (or beamlets of secondary and/or backscattered electrons) can be provided. Thereby, a detection scheme as described with respect to FIG. 7A can be provided. FIG. 7A shows an electron beam column wherein the electrons pass substantially along a straight optical axis from the emitter to the specimen. Above the objective lens, a Wien filter element 73 or another element for separating the primary and signal beamlets is provided. The Wien filter element has, when excited, magnetic and electric fields such that primary electrons with a predetermined energy pass through the filter element 73 in an undisturbed manner. However, charged particles having a direction different from the primary electrons are deflected by the combination of the electric and magnetic field. As a result, secondary particles that are released from the specimen and that have passed from the specimen through the objective lens are deflected to detector 61*a*. According to some implementations also a segmented detector or two or more detection elements can be provided.

According to embodiments described herein, a detection element is an element that is capable of detecting a signal electron or signal particle and generates a signal to be evaluated, i.e. an electrical signal. Thereby, according to some implementations, the detection element may include a generation to photons, e.g. in a scintillator, and a subsequent generation of an electrical signal from the photons, e.g. in photomultiplier. Yet, according to other embodiments a semiconductor detection element, e.g. a diode can be provided.

Herein, reference is inter alia made to signal electrons and sometimes to secondary electrons. According to yet further embodiments described herein, which can be combined with other embodiments described herein, it is to be understood that all other particles, particularly SEs and/or BSEs can be utilized as signal electrons (or secondary particles for signal generation).

Alternatively to the embodiment shown in FIG. 7A, two deflectors can be utilized to separate the primary and signal beamlets. Without being limited thereto, the deflectors of this example are indicated as magnetic deflectors. In FIG. 7A, emitter 12 emits electron beam 11, which is extracted by extractor 213 and further shaped by anode 14. The independent electron beam bundles formed by aperture 26 or an aperture arrangement with two or more aperture openings can be deflected in a first deflector, e.g. after passing through a condenser lens. Thereby, the independent electron beams travel nonparallel to the optical axis. A second deflector deflects the independent electron beams to travel substantially parallel to the optical axis. Thereafter, the independent electron beams are focused into a common electron probe by objective lens 18. Additionally, depending on the desired impingement location on the specimen, scanning deflector 57 can be used for scanning the independent electron beams over the specimen. The secondary and/or backscattered charged particles that have passed through the objective lens, and travel upwardly in the electron beam column, are deflected by the second deflector or by the Wien filter 73. Since the deflection of the magnetic field depends on the direction of the secondary and/or backscattered charged particles, these particles are deflected towards detector 61*a*.

Figure 8A:
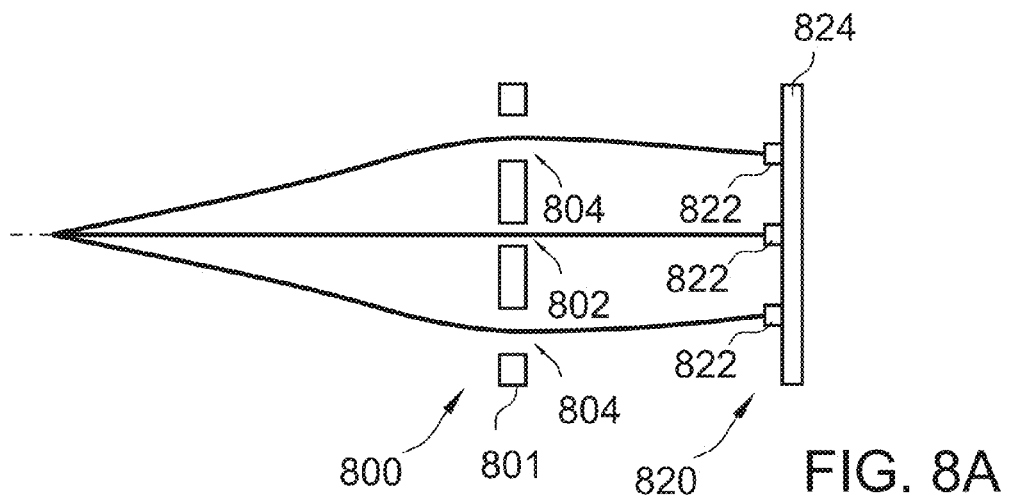
FIGS. 8A and 8B illustrate a secondary particle optics and a detection assembly according to embodiments described herein.
Figure 8B:
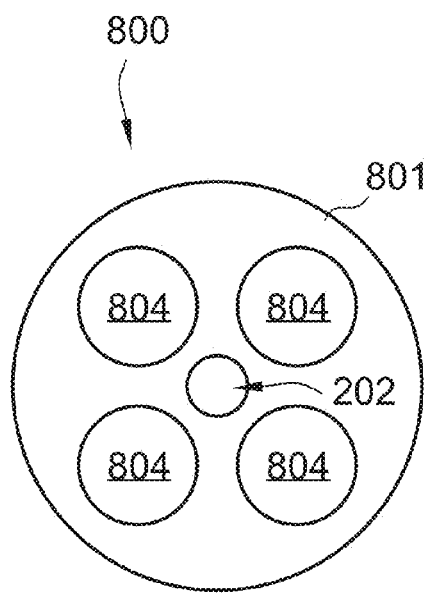
Figure 8C:
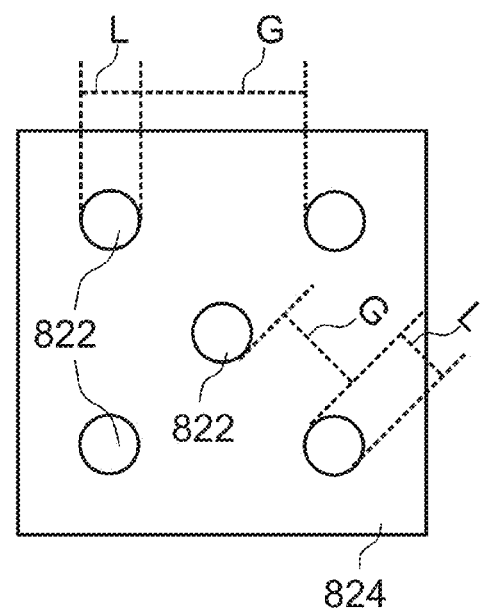
FIG. 8C illustrates a view of a detector arrangement according to embodiments described herein.

FIG. 8A shows a detector arrangement 820, with detection elements 822. As can be seen in FIGS. 8A and 8C, the detection elements 822 are separated from each other by a gap between the detection elements 822. The detection elements 822 are supported by a holder 824 of the detector arrangement 820. The detection elements can be selected from the group consisting of: diodes, scintillators, and other scintillator based detection elements.

According to some embodiments, which can be combined with other embodiments described herein, a segmented detector arrangement can be provided by providing segmented scintillators, wherein each scintillator segment is in optical communication with a photomultiplier, wherein each segment is in optical communication with an individual detection channel, or wherein each segment is in optical communication with another photon detection element, or can be provided by a scintillator that is connected to two or more, typically five or a plurality of optical fibers, such that the topography information can be maintained. Utilizing scintillation based detector arrangements has the advantage that a separation of the signal beamlets or signal beam bundles is easier as compared to diodes. For example, the need for an enhanced of signal beamlet separation might be avoided or reduced because the scintillators and/or optical fibers can be arranged close to each other. Utilizing diodes for a detector arrangement can improve the throughput as described below. However, additional measures for topography detection might be beneficial.

According to typical embodiments, which can be combined with other embodiments described herein, the separation, i.e. the gap between the detection elements 822, has at least the same length in the corresponding dimension as the active area of the detection elements 822. According to typical embodiments, the gap can be in a range of 1 mm to 10 mm. A typical ratio G/L of the gap and the corresponding length of active area, which can be utilized alternatively or additionally to the above-mentioned gap dimension, can be 1 or above and 7 or below.

According to yet further embodiments, which can be combined with other embodiments described herein, the detection elements 822 can be PIN-diodes, which are used as the sensor for detecting secondary particles, for example secondary electrons. PIN-Diodes can be used for high-speed detection applications in light of their large bandwidth, for example, in the range of 1 to 10 GHz or 2 GHz or above. Thereby, the active area of the Pin-diodes limits the detection speed. That is, the larger the active area of the pin diode, the slower the detection speed. Accordingly, the active area of the pin diodes is reduced to an area of 1 $mm^2$ or below, in order to provide the desired detection speed of 2 GHz or above. The size of the active area of the detection element 822 delimits the ratio of the detection area as compared to the gaps there in-between. Accordingly, the detector arrangement 820 having a desired bandwidth for high-speed detection is provided with the gaps between the active areas of the detection elements. Accordingly, a spatial separation, which is dictated by the design of the detection elements 822 can typically be provided.

According to embodiments described herein, a secondary particle optics 800 is provided. As shown in FIGS. 8A and 8B, the particle optics 800 includes at least an aperture plate 801 having two or more aperture openings. The aperture plate 801 can be biased to a deceleration potential. Thereby, the deceleration of the aperture plate 801 in combination with an acceleration of the detection elements 822 are configured for a separation and focusing of the secondary particles, e.g. the secondary electron beam. In light of the two or more aperture openings, the separation of the secondary beam on different detection elements can be provided. According to typical embodiments, the aperture plate 801 has a central aperture opening 802 and at least two radially outer aperture openings 804. Typically, four outer aperture openings 804 can be provided.

According to typical embodiments, the secondary optics 800 includes the aperture plate 801 with a single central aperture opening or hole surrounded by a group of at least 4 outer aperture openings or outer holes. Thereby, the center can e.g. be being defined by the optical axis of the signal beam bundle. The plate can be arranged perpendicular to this optical axis. Detection elements 822 of detector assembly 820 are positioned behind the plate, e.g. in a plane parallel to the aperture.

According to typical operation conditions for a 3-D measurement, the signal beamlets, e.g. the SE beamlets, are divergent and the plate is biased such that the SEs are decelerated while they approach the plate. When the electrons are slow, they are easily deflected towards the aperture openings in the plate, which means that the SE bundles can split into a central portion and a group of at least 4 bundles, corresponding to other tilted beam bundles or beamlets. Thereby, the topographic structure of the specimen defines both, the tilt angle for the primary beamlets and the starting angle of the signal beamlets. Accordingly, a correlation between primary beamlets and signal beamlets can be provided.

After passing through the aperture openings, the secondary particles are accelerated again to a significantly higher energy, e.g. a similar energy, which the secondary particles have before entering into the decelerating field of the aperture plate. According to typical embodiments, the secondary particles can have an energy of about 20 keV to 50 keV, e.g. 30 keV, before deceleration. They are decelerated to an energy of 100 eV to 15 keV, e.g. 5 keV, when passing through the aperture plate. Thereafter, they are accelerated to an energy of about 20 keV to 50 keV, e.g. 30 keV, towards the detection elements 822. This acceleration has a focusing effect which allows for concentrating the separated bundles on the small detection elements. The distribution of the secondary particles, e.g. the secondary electrons of the signal beam, behind the aperture plate is not just a projection of the holes in the aperture plate: the deceleration deflects the secondary particles to the holes that would otherwise just hit the plate and get lost; the accelerating field between the aperture plate and the detection elements concentrates the individual bundles of the signal beam, which would, without the biasing of the aperture plate and the detection elements, be too large for a small high speed sensor.

According to some embodiments, which can be combined with other embodiments described herein, a secondary particle optics 800 as shown in FIG. 8B can be provided. The central aperture opening 802 in the aperture plate 801 corresponds to the central detection element 822 of FIG. 8C. The outer aperture openings 804 correspond to the outer detection elements 822 in FIG. 8C. According to typical embodiments, the diameter or the corresponding dimension of the aperture openings can be 1 mm to 4 mm for the central aperture opening 802. For the outer aperture openings 804 the diameter or a corresponding dimension can be 3 mm to 10 mm.

Figure 9A:
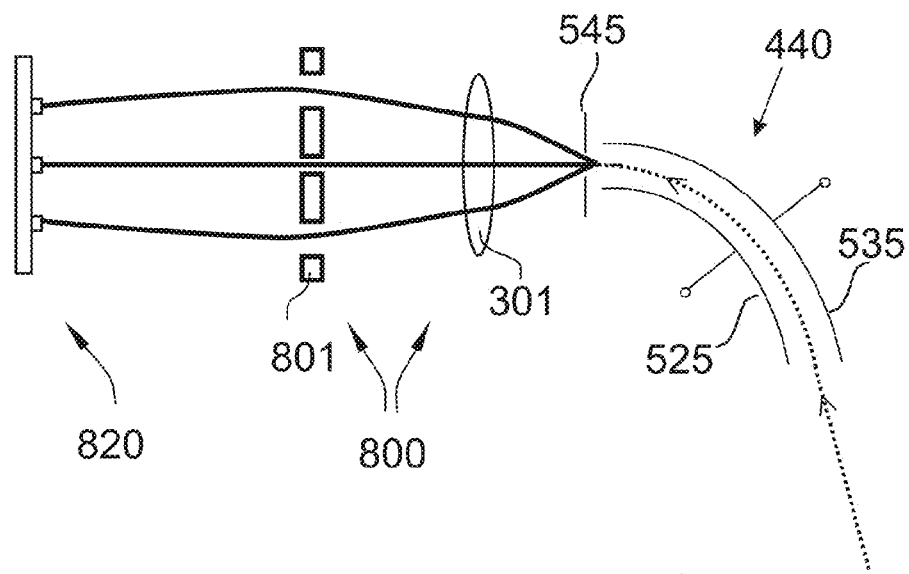
FIGS. 9A and 9B show schematic side views of charged particle units according to embodiments described herein.

Further embodiments will be described with respect to FIGS. 9A and 9B. FIG. 9A shows a sector 440. Sector 440 has a negatively-charged U-bend 535 and a positively-charged U-bend 525 serving to bend the electron beam. Optionally, a pair of sector side plates can be provided. Thereby, the electron beam is focused in one dimension and, additionally, is kept at a high energy to avoid time of flight effects which may have impact on high-speed detection. A focusing in the second dimension takes place in quadrupole element 545. Thereby, the sector 440 and the quadrupole form a double-focusing sector unit. Further, it may be possible to use a cylinder lens instead of a quadrupole to obtain double focusing.

The electron beam enters secondary beam optics 800 as described herein. Thereafter a detection at high speed and including a topography information correlated to the starting angle can be provided by detector assembly 820.

Figure 9B:
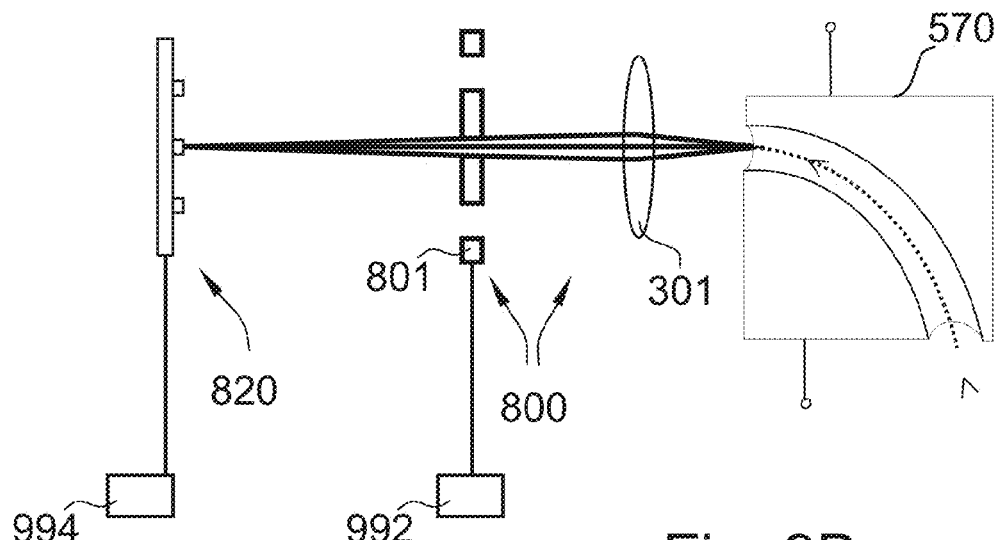

In the further embodiment of FIG. 9B a hemispherical sector 570 is used. In view of the hemispheric shape the electron beam entering the sector is focused in both dimensions. Thus, no additional focusing unit is required for the double-focusing sector unit 570. The secondary particles result in signal generations as described above.

According to yet further embodiments, which can be combined with other embodiments described herein, FIG. 9B further illustrates voltage supplies 992 and 994. Voltage supply 992 is connected to aperture plate 801 for biasing thereof. Thereby, a deceleration field as described above can be provided. According to typical examples, the deceleration field can correspond to a decrease of particle energy of about 20 keV to 30 keV. Voltage supply 994 is connected to detection elements 822 in order to accelerate the secondary particles towards the detection elements 822. Thereby, also a focusing is provided. The acceleration field can correspond to an increase of particle energy of about 20 keV to 30 keV.

According to a further embodiment (not shown) the focusing of the double focusing sector unit (440, 545 in FIG. 9A or 570 in FIG. 9B) can be assisted with an additional focusing unit 301. Thus, the double focusing sector unit may also include additional lenses, for example an Einzel-lens. This additional lens may also be applied to move the focus of the sector to a position corresponding to the position of the filter, e.g. the potential saddle formed in the central opening of the aperture plate.

According to embodiments described herein, a charged particle beam system, particularly for electron beam inspection, is provided. Improved defect review due to 3D imaging with a switchable aperture-array, a switchable multi-aperture and/or a switchable aperture with varying aperture opening location can be provided.

While the foregoing is directed to embodiments of the invention, other and further embodiments of the invention may be devised without departing from the basic scope thereof, and the scope thereof is determined by the claims that follow.

The invention claimed is:

1. A charged particle beam device, comprising:
    a charged particle beam source for emitting a charged particle beam;
    a switchable multi-aperture for generating two or more beam bundles from the charged particle beam, wherein the switchable multi-aperture comprises:
        two or more aperture openings, wherein each of the two or more aperture openings is provided for generating a corresponding beam bundle of the two or more beam bundles;
        a beam blanker arrangement configured for individually blanking the two or more beam bundles, wherein the beam blanker arrangement comprises two or more multi-pole elements selected from the group consisting of a quadrupole, an hexapole, an octupole, and an n-pole with n>8, wherein a first multi-pole element of the two or more multi-pole elements is configured to allow for at least one beam bundle adjustment for a first beam bundle of the two or more beam bundles, wherein a second multi-pole element of the two or more multi-pole elements is configured to allow for at least one beam bundle adjustment for a second beam bundle of the two or more beam bundles, wherein the beam bundle adjustment is selected from the group consisting of: beam bundle position, beam bundle astigmatism correction, beam bundle focusing, and beam bundle focus adjustment; and
        a stopping aperture for blocking beam bundles, which are blanked off by the beam blanker arrangement;
    a control unit electrically connected to the beam blanker arrangement and configured to control the individual blanking of the two or more beam bundles for switching of the switchable multi-aperture; and
    an objective lens configured for focusing the two or more beam bundles on a specimen or wafer, wherein the two or more beam bundles are tilted with respect to the specimen or wafer depending on the position of each of the two or more beam bundles relative to an optical axis defined by the objective lens, and wherein the objective lens is configured for focusing the charged particle beam source, a virtual source provided by the charged particle beam source or a crossover.

2. The device according to claim 1, wherein the beam blanker arrangement is provided in the same module as the two or more aperture openings or wherein the plane of the blanker arrangement perpendicular to the optical axis has a distance from the plane of the two or more aperture openings, which distance is 10 mm or less.

3. The device according to claim 1, wherein the beam blanker arrangement is provided in the same module as the two or more aperture openings and wherein the plane of the blanker arrangement perpendicular to the optical axis has a distance from the plane of the two or more aperture openings, which distance is 10 mm or less.

4. The device according to claim 2, wherein the plane of the blanker arrangement perpendicular to the optical axis has a distance from the plane of the two or more aperture openings, which distance is 3 mm or less.

5. The device according to claim 1, wherein the two or more beam bundles are focused within the same area of the specimen or wafer.

6. The device according to claim 5, wherein the two or more beam bundles are focused onto the same location within the focal plane wherein the same location within the focal plane is a probe generated on a specimen, which is an image of the source, the virtual source or the crossover.

7. The device according to claim 1, wherein at least one aperture opening of the two or more aperture openings are configured to change its position in a projection on a plane perpendicular to the optical axis.

8. The device according to claim 1, further comprising:
a separating unit configured for separating the two or more beam bundles, which are focused on the specimen or wafer, from signal electrons generated on impingement of the two or more beam bundles on the specimen or wafer.

9. The device according to claim 1, further comprising:
a detector arrangement having two or more detection segments or detection elements.

10. The device according to claim 9, wherein the two or more detection segments are provided by a segmented scintillator, by a fiber optics receiving photons from a photon generating element, or by a scintillator and a fiber optics, which guide the signal to separate detection elements of the two or more detection elements.

11. The device according to claim 9, wherein the detector arrangement having at least two detection elements with active detection areas, wherein the active detection areas are separated by a gap;
a particle optics configured for separating the signal electrons into a first portion of the signal electrons and into at least one second portion of the signal electrons, and configured for focusing the first portion of the signal electrons and the at least one second portion of the signal electrons, wherein the particle optics comprises:
an aperture plate; and
at least a first aperture opening in the aperture plate, and at least one second aperture opening in the aperture plate, wherein the aperture plate is configured to be biased to one potential surrounding the first aperture opening and the at least one second aperture opening.

12. The device according to claim 11, wherein the at least one second aperture opening is at least one second radially outer aperture opening.

13. The device according to claim 12, wherein the at least one second aperture opening is at least four outer aperture openings.

14. A method of generating a 3D image of a specimen or wafer, comprising:
imaging the specimen or wafer with a first group of beam bundles, wherein the first group of beam bundles includes one or more beam bundles;
switching from the first group of beam bundles to a second group of beam bundles with a switchable multi-aperture, wherein the second group of beam bundles can include one or more beam bundles, and wherein at least one beam bundle differs in the second group of beam bundles as compared to the first group of beam bundles; and
imaging the specimen or wafer with the second group of beam bundles, wherein the one or more beam bundles are tilted with respect to the specimen or wafer depending on the position of each of the one or more beam bundles relative to an optical axis defined by an objective lens, wherein the switchable multi-aperture comprises a beam blanker arrangement configured for individually blanking a group of beam bundles, and wherein the beam blanker arrangement comprises two or more multi-pole elements selected from the group consisting of: a quadrupole, an hexapole, an octupole, or an n-pole with n>8, wherein a first multi-pole element of the two or more multi-pole elements is configured to allow for at least one beam bundle adjustment for the first group of beam bundles, wherein a second multi-pole element of the two or more multi-pole elements is configured to allow for at least one beam bundle adjustment for the second group of beam bundles, wherein the beam bundle adjustment is selected from the group consisting of: beam bundle position, beam bundle astigmatism correction, beam bundle focusing, and beam bundle focus adjustment.

15. The method according to claim 14, wherein the switchable multi-aperture has:
two or more aperture openings, wherein each of the two or more aperture openings is provided for generating a corresponding beam bundle, and a stopping aperture for blocking beam bundles, which are blanked off by the beam blanker arrangement; and
wherein the switching from the first group of beam bundles to a second group of beam bundles comprises control of the individual blanking of beam bundles.

16. The method according to claim 14, wherein a high current imaging mode is provided by switching on at least 80% of the beam bundles, wherein in an arbitrary sequential order a hole imaging mode is provided by switching on only a center beam bundle, wherein the center beam bundle is the beam bundle with the smallest distance to the optical axis, and wherein in an arbitrary sequential order a side-enhanced imaging mode is provided by switching on one or more beam bundles from the enhanced side and switching off one or more beam bundles from a second side opposite to the enhanced side.

* * * * *